US012156350B2

(12) United States Patent
Park et al.

(10) Patent No.: US 12,156,350 B2
(45) Date of Patent: Nov. 26, 2024

(54) MOBILE TERMINAL

(71) Applicant: LG ELECTRONICS INC., Seoul (KR)

(72) Inventors: Bumoh Park, Seoul (KR); Kiseong Mun, Seoul (KR); Kyungsoo Son, Seoul (KR); Insu Song, Seoul (KR); Kyuho Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 395 days.

(21) Appl. No.: 17/630,773

(22) PCT Filed: Jul. 30, 2019

(86) PCT No.: PCT/KR2019/009484
§ 371 (c)(1),
(2) Date: Jan. 27, 2022

(87) PCT Pub. No.: WO2021/020619
PCT Pub. Date: Feb. 4, 2021

(65) Prior Publication Data
US 2022/0272852 A1 Aug. 25, 2022

(51) Int. Cl.
*G06F 1/16* (2006.01)
*H05K 5/00* (2006.01)
(Continued)

(52) U.S. Cl.
CPC ......... *H05K 5/0217* (2013.01); *H05K 5/0017* (2013.01)

(58) Field of Classification Search
CPC .. H05K 5/0217; H05K 5/0017; H05K 5/0018; H05K 5/0221; H05K 5/0226; H05K 5/023; H05K 5/0234; H05K 5/0241
See application file for complete search history.

(56) References Cited

U.S. PATENT DOCUMENTS

2018/0103552 A1* 4/2018 Seo .................. H05K 5/0017
2019/0025945 A1* 1/2019 Lindblad ............ H10K 59/40
(Continued)

FOREIGN PATENT DOCUMENTS

KR 1020170019043 2/2017
KR 1020180040181 4/2018
(Continued)

OTHER PUBLICATIONS

PCT International Application No. PCT/KR2019/009484, International Search Report dated Apr. 29, 2020, 18 pages.
(Continued)

*Primary Examiner* — Anthony M Haughton
(74) *Attorney, Agent, or Firm* — LEE, HONG, DEGERMAN, KANG & WAIMEY

(57) ABSTRACT

A mobile terminal comprises: a frame having a changing shape or size; a flexible display unit having one side facing outwards, and comprising a fixed portion coupled to the frame and a variable portion bent in a first direction; and a support frame located on the other side of the variable portion of the flexible display unit, wherein the support frame comprises: a plurality of rigid bars extending in a second direction perpendicular to the first direction and arranged side by side in the first direction; and a flexible portion for combining the rigid bars, wherein the support frame bends well in response to the flexural deformation of the flexible display unit and at the same time stably supports the other side of the variable portion, so that the flexible display unit may be stably deformed according to the deformation of the mobile terminal.

9 Claims, 8 Drawing Sheets

(51) Int. Cl.
  *H05K 5/02*   (2006.01)
  *H05K 7/00*   (2006.01)

(56) References Cited

U.S. PATENT DOCUMENTS

| | | | |
|---|---|---|---|
| 2019/0064881 A1* | 2/2019 | Kim | G06F 1/1652 |
| 2019/0174640 A1* | 6/2019 | Park | G02F 1/133305 |
| 2020/0363841 A1* | 11/2020 | Kim | G06F 1/1626 |
| 2021/0286407 A1* | 9/2021 | Kim | G06F 1/1616 |
| 2023/0195167 A1* | 6/2023 | Jung | G06F 1/1641 |
| | | | 455/575.4 |

FOREIGN PATENT DOCUMENTS

| | | |
|---|---|---|
| KR | 1020190023919 | 3/2019 |
| KR | 1020190062855 | 6/2019 |
| KR | 1020190077292 | 7/2019 |
| WO | 2019107909 | 6/2019 |

OTHER PUBLICATIONS

European Patent Office Application Serial No. 19939124.4, Search Report dated Mar. 16, 2023, 12 pages.

* cited by examiner

FIG. 3
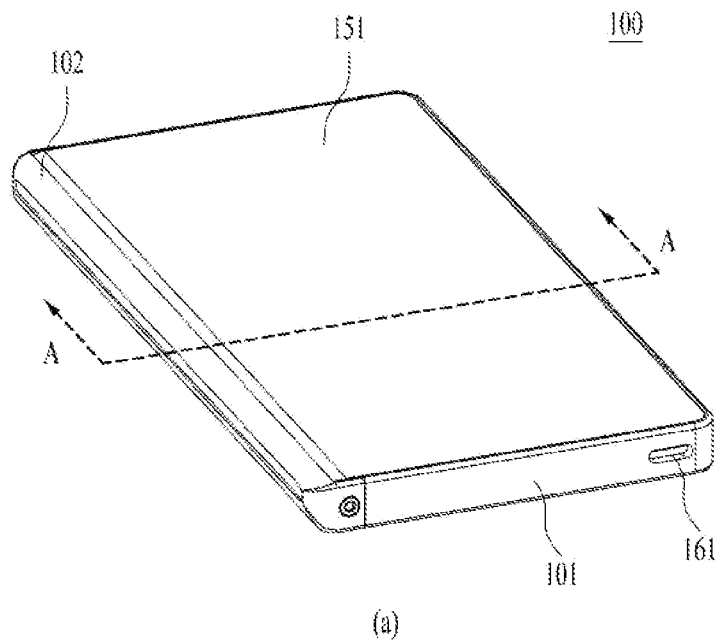
(a)
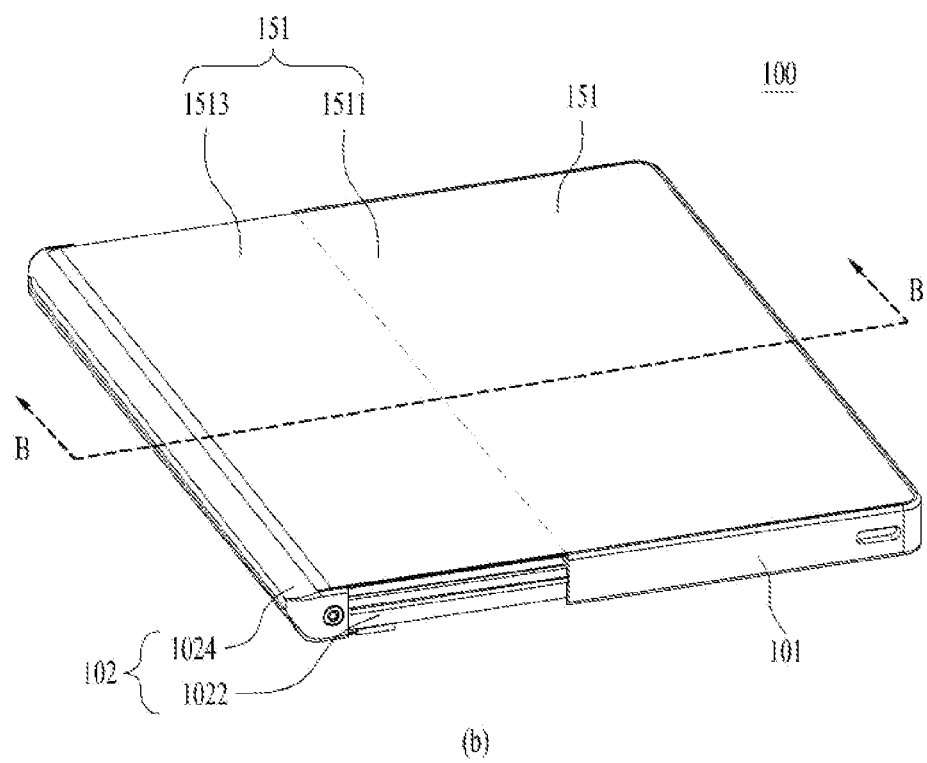
(b)

FIG. 4
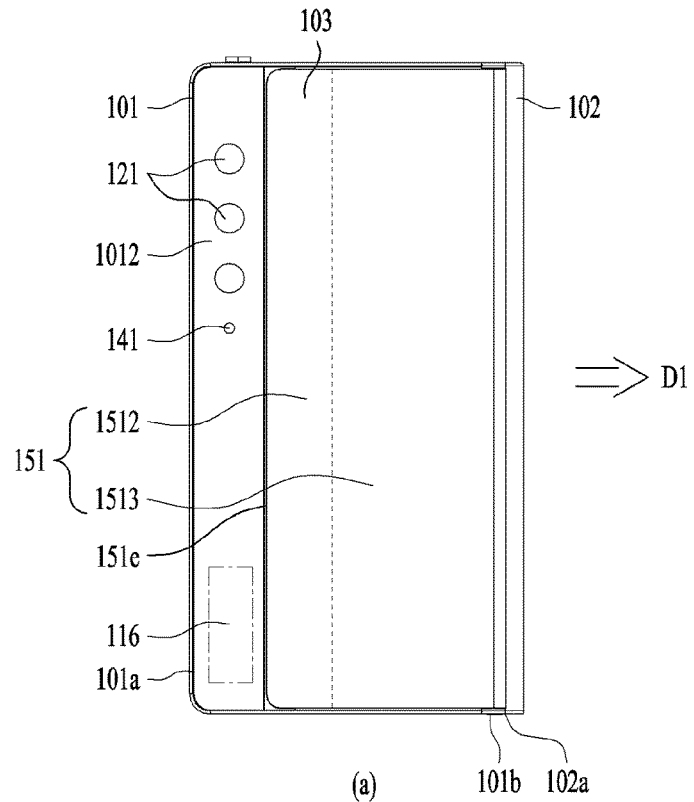
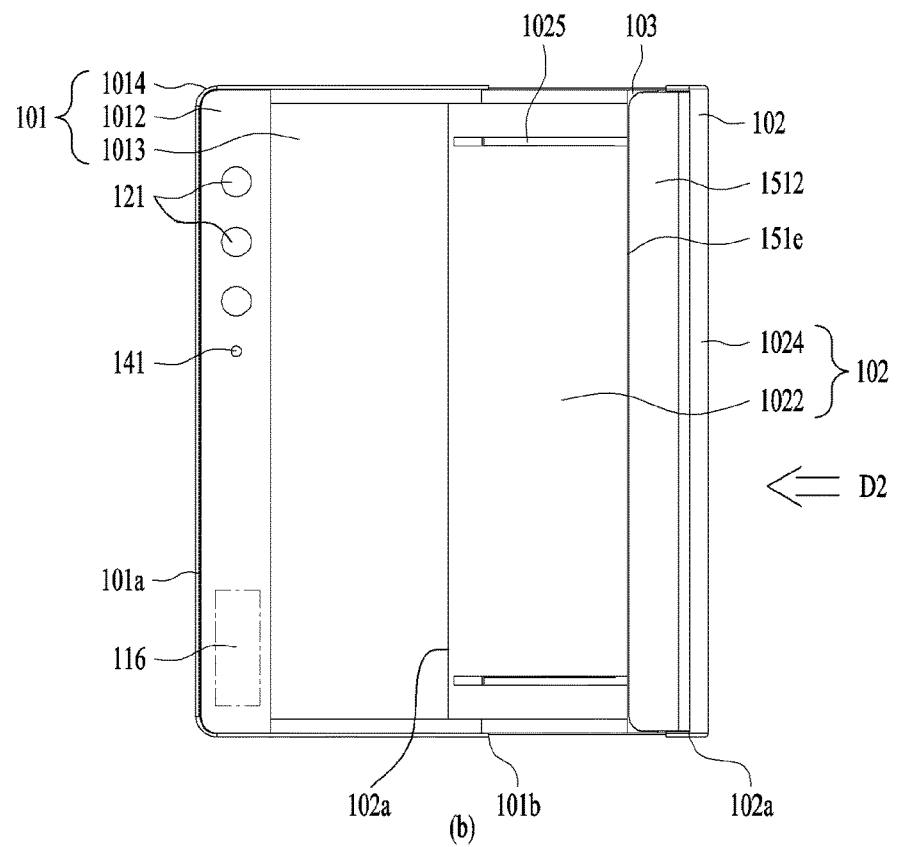

(a)　　　　　　　　(b)

FIG. 7
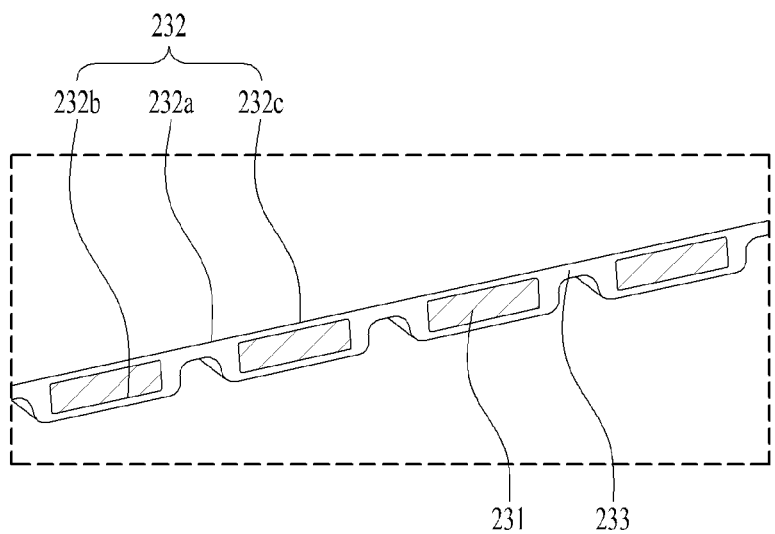
(a)
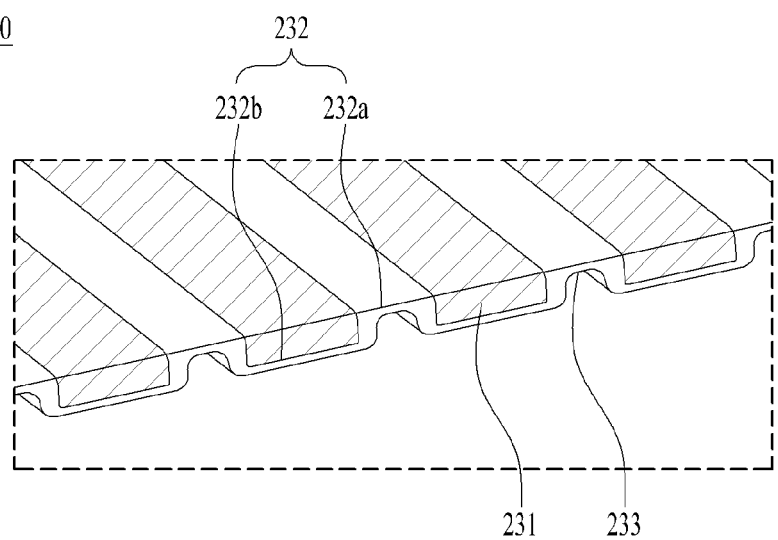
(b)

FIG. 8
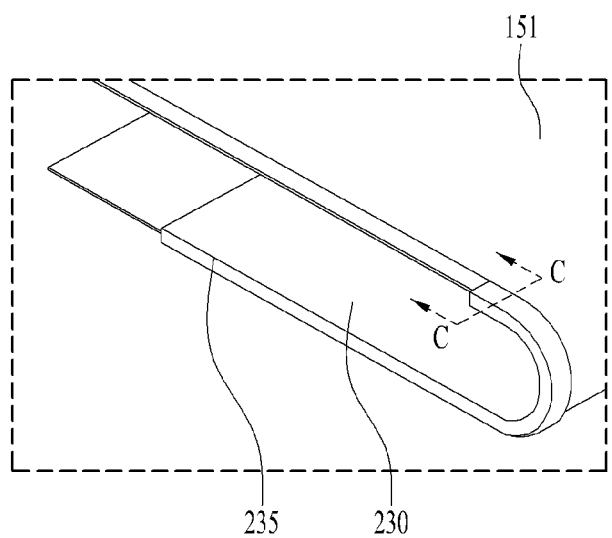
(a)
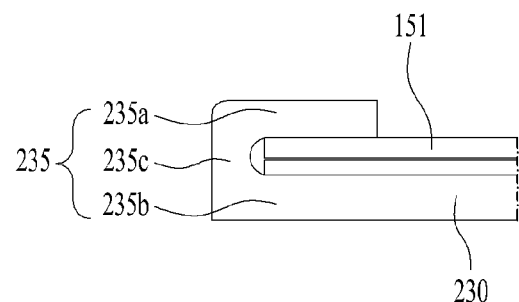
(b)

MOBILE TERMINAL

CROSS-REFERENCE TO RELATED APPLICATIONS

This application is the National Stage filing under 35 U.S.C. 371 of International Application No. PCT/KR2019/009484, filed on Jul. 30, 2019, the contents of which are hereby incorporated by reference herein their entirety.

TECHNICAL FIELD

The present disclosure relates to a mobile terminal, and more particularly, to a mobile terminal having a flexible display.

BACKGROUND ART

Terminals may be generally classified as mobile/portable terminals or stationary terminals according to their mobility. Mobile terminals may also be classified as handheld terminals or vehicle mounted terminals according to whether or not a user can directly carry the terminal.

A display device is a device having a function of receiving, processing, and displaying a video that a user may watch. For example, the display device receives a broadcast selected by the user from broadcast signals transmitted from a broadcasting station, separates a video signal from the received signals, and displays the separated video signal on a display.

In recent years, because of a development of a broadcasting technology and a network technology, functions of the display device have also been considerably diversified, and a performance of the device has been improved accordingly. That is, the display device has been developed to provide not only broadcast contents but also various other contents to the user. For example, the display device may provide game play, music listening, internet shopping, user customized information, and the like using various applications as well as programs received from the broadcasting station. In order to perform such extended functions, the display device may be basically connected to other devices or networks using various communication protocols, and may provide the user with an ubiquitous computing environment. In other words, the display device has evolved into a smart device that enables connectivity to a network and continuous computing.

Recently, a flexible display, which has sufficient elasticity, and thus, be able to be deformed largely, has been developed. Such a flexible display can be deformed to the extent that it can be wound around a roll. A mobile terminal may receive a rolled flexible display and project the display to the outside of a body with a desired size. Accordingly, the mobile terminal may have a more compact structure by using the flexible display. In addition, by including such a winding display, the mobile terminal may be referred to as a rollable mobile terminal.

To use such a rollable mobile terminal, a display may be withdrawn from a body, and at the same time as the withdrawal, the display may be extended to a size desired by a user. However, the display may be extended in various directions by the user, and the relative orientation or arrangement of the display for the user may also vary depending on a direction of extension. Accordingly, in order to show an intended content or screen to a user well, a mobile terminal needs to orient the content or screen on a display in consideration of such a changed display or user's relative orientation. Furthermore, the mobile terminal needs to additionally adjust the oriented content in consideration of the extension direction and orientation.

DISCLOSURE OF THE INVENTION

Technical Task

One technical task of the present disclosure is to provide a mobile terminal capable of stably changing a shape by improving a structure supporting a variable portion of a flexible display unit.

Technical Solutions

In one technical aspect of the present disclosure, provided is a mobile terminal including a frame varying in shape or size, a flexible display unit including a fixed portion coupled to the frame by having one side facing outward and a variable portion bent in a first direction, and a support frame supporting the variable portion in a manner that one side is disposed to face the other side of the variable portion of the flexible display unit, the support frame including a plurality of rigid bars extended in a second direction vertical to the first direction and disposed side by side with the first direction and a flexible portion coupling the rigid bars.

The flexible portion may include a plurality of first flexible portions located between a plurality of the rigid bars and a second flexible portion connecting gaps between the first flexible portions and covering the other side of the rigid bar facing the frame.

The first flexible portion may include a groove recessed from a direction of the other side of the support frame and the groove may be extended in the second direction.

The mobile terminal may further include an adhesive tape located between the support frame and the flexible display unit, and one side of the rigid bar may be exposed and contact with the adhesive tape.

The mobile terminal may further include a lateral protection portion covering both lateral sides of the variable portion of the flexible display unit in a second direction vertical to the first direction and formed of flexible material.

The lateral protection portion may include a first protection portion located at an end portion of one side of the flexible display unit, a second protection portion located at an end portion of the other side of the flexible display unit, and a third protection portion covering a lateral side of the flexible display unit, and the first to third protection portions may form a u-shaped structure.

The first protection portion and the second protection portion may contact with one side and the other side of the flexible display unit and the third protection portion may be spaced apart from the lateral side of the flexible display unit.

The lateral protection portion may be connected to the support frame.

The frame may include a first frame having a front side coupled with the fixed portion of the flexible display unit and a second frame sliding to move in the first direction with respect to the first frame, and the variable portion may vary in a position bent in response to a slide moving position of the second frame.

The frame may include a first frame and a second frame located on one side of the first frame and varying in an angle to the first frame, the flexible display unit may be located on front sides of the first frame and the second frame, and the variable portion may vary in a curvature depending on an angle between the first frame and the second frame.

The flexible portion may include silicon.

Advantageous Effects

In a mobile terminal of the present disclosure, a support frame is well bent to correspond to the bending deformation of a flexible display unit and stably supports the other side of a variable portion, thereby stably deforming the flexible display unit in response to deformation of the mobile terminal.

In addition, it is possible to prevent damage to a lateral side of the variable portion of the flexible display unit by providing a lateral protection portion for protecting the lateral side of the variable portion of the flexible display unit.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

DESCRIPTION OF DRAWINGS

FIG. 3 shows perspective views respectively illustrating a first state and a second state viewed from one side of a mobile terminal according to one embodiment.

FIG. 4 shows rear face views respectively illustrating a first state and a second state of a mobile terminal according to one embodiment.

FIG. 7 is a diagram showing a support frame according to an embodiment of the present disclosure.

FIG. 8 is a diagram showing a lateral protection portion of the present disclosure.

BEST MODE FOR INVENTION

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Figure 1:
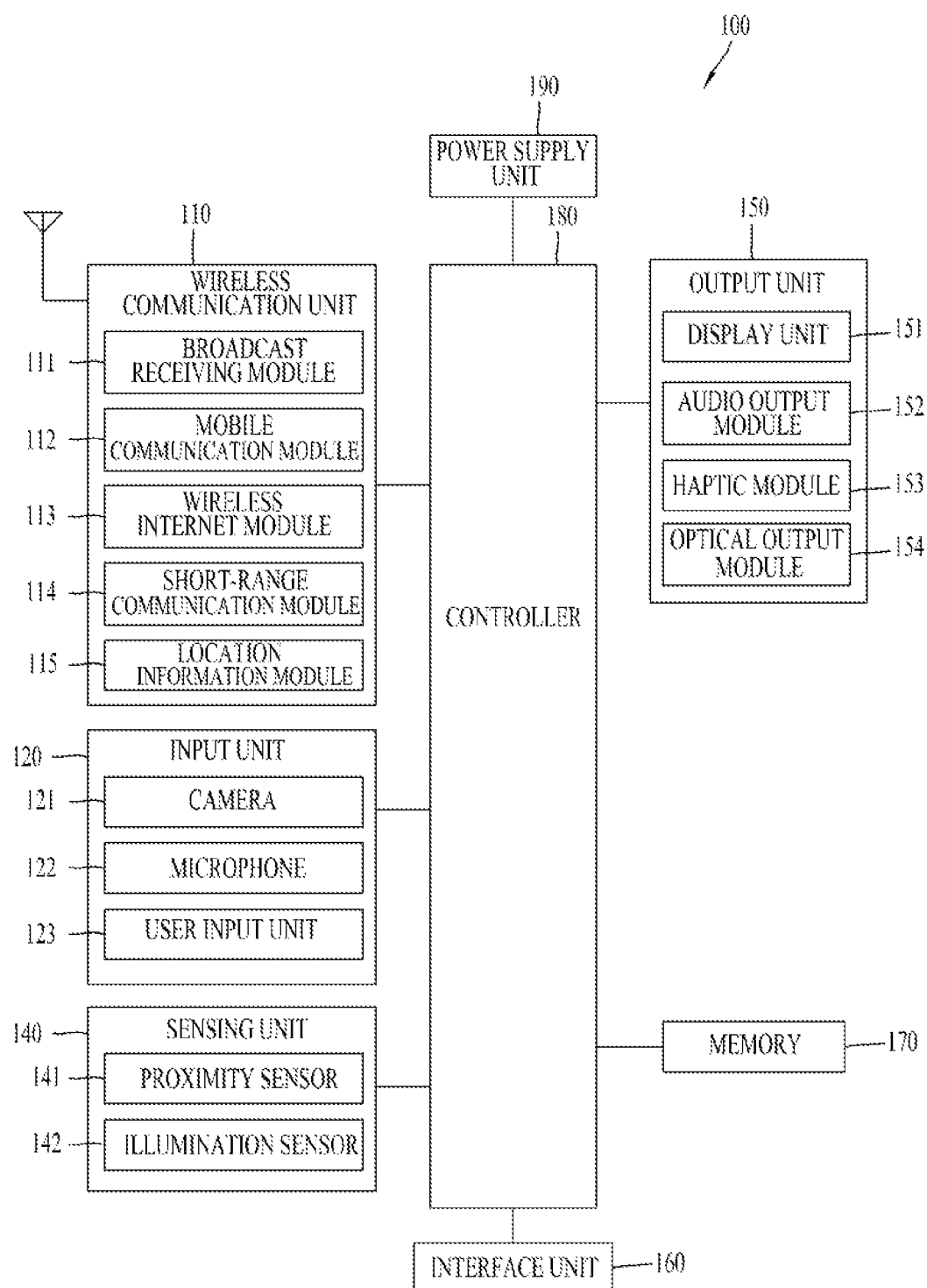
FIG. 1 is a block diagram of a mobile terminal in accordance with the present disclosure.

FIG. 1 is a block diagram of a mobile terminal in accordance with the present disclosure.

The mobile terminal 100 is shown having components such as a wireless communication unit 110, an input unit 120, a sensing unit 140, an output unit 150, an interface unit 160, a memory 170, a controller 180, and a power supply unit 190. It is understood that implementing all of the illustrated components in FIG. 1A is not a requirement, and that greater or fewer components may alternatively be implemented than the components listed above.

More specifically, the wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks.

To facilitate such communications, the wireless communication unit 110 includes one or more of a broadcast receiving module 111, a mobile communication module 112, a wireless Internet module 113, a short-range communication module 114, and a location information module 115.

Regarding the wireless communication unit 110, the broadcast receiving module 111 is typically configured to receive a broadcast signal and/or broadcast associated information from an external broadcast managing entity via a broadcast channel. The broadcast channel may include a satellite channel, a terrestrial channel, or both. In some embodiments, two or more broadcast receiving modules 111 may be utilized to facilitate simultaneously receiving of two or more broadcast channels, or to support switching among broadcast channels.

The mobile communication module 112 can transmit and/or receive wireless signals to and from one or more network entities. Typical examples of a network entity include a base station, an external mobile terminal, a server, and the like. Such network entities form part of a mobile communication network, which is constructed according to technical standards or communication methods for mobile communications (for example, Global System for Mobile Communication (GSM), Code Division Multi Access (CDMA), CDMA2000 (Code Division Multi Access 2000), EV-DO (Enhanced Voice-Data Optimized or Enhanced Voice-Data Only), Wideband CDMA (WCDMA), High Speed Downlink Packet access (HSDPA), HSUPA (High Speed Uplink Packet Access), Long Term Evolution (LTE), LTE-A (Long Term Evolution-Advanced), and the like).

Examples of wireless signals transmitted and/or received via the mobile communication module 112 include audio call signals, video (telephony) call signals, or various formats of data to support communication of text and multimedia messages.

The wireless Internet module 113 is configured to facilitate wireless Internet access. This module may be internally or externally coupled to the mobile terminal 100. The wireless Internet module 113 may transmit and/or receive wireless signals via communication networks according to wireless Internet technologies.

Examples of such wireless Internet access include Wireless LAN (WLAN), Wireless Fidelity (Wi-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), HSUPA (High Speed Uplink Packet Access), Long Term Evolution (LTE), LTE-A (Long Term Evolution-Advanced), and the like. The wireless Internet module 113 may transmit/receive data according to one or more of such wireless Internet technologies, and other Internet technologies as well.

In some embodiments, when the wireless Internet access is implemented according to, for example, WiBro, HSDPA, HSUPA, GSM, CDMA, WCDMA, LTE, LTE-A and the like, as part of a mobile communication network, the wireless Internet module 113 performs such wireless Internet access. As such, the Internet module 113 may cooperate with, or function as, the mobile communication module 112.

The short-range communication module 114 is configured to facilitate short-range communications. Suitable technologies for implementing such short-range communications include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, Wireless USB (Wireless Universal Serial Bus), and the like. The short-range communication module 114 in general supports wireless communications between the mobile terminal 100 and a wireless communication system, communications between the mobile terminal 100 and another mobile terminal 100, or communications between the mobile terminal and a network where another mobile terminal 100 (or an external server) is located, via wireless area networks. One example of the wireless area networks is a wireless personal area networks.

The location information module 115 is generally configured to detect, calculate, derive or otherwise identify a position of the mobile terminal. As an example, the location information module 115 includes a Global Position System (GPS) module, a Wi-Fi module, or both. If desired, the location information module 115 may alternatively or additionally function with any of the other modules of the wireless communication unit 110 to obtain data related to the position of the mobile terminal. As one example, when the mobile terminal uses a GPS module, a position of the mobile terminal may be acquired using a signal sent from a GPS satellite. As another example, when the mobile terminal uses the Wi-Fi module, a position of the mobile terminal can be acquired based on information related to a wireless access point (AP) which transmits or receives a wireless signal to or from the Wi-Fi module.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed as a user's control command.

Such cameras 121 may process image frames of still pictures or video obtained by image sensors in a video or image capture mode. The processed image frames can be displayed on the display unit 151 or stored in memory 170. In some cases, the cameras 121 may be arranged in a matrix configuration to permit a plurality of images having various angles or focal points to be input to the mobile terminal 100. As another example, the cameras 121 may be located in a stereoscopic arrangement to acquire left and right images for implementing a stereoscopic image.

The microphone 122 is generally implemented to permit audio input to the mobile terminal 100. The audio input can be processed in various manners according to a function being executed in the mobile terminal 100. If desired, the microphone 122 may include assorted noise removing algorithms to remove unwanted noise generated in the course of receiving the external audio.

The user input unit 123 is a component that permits input by a user. Such user input may enable the controller 180 to control operation of the mobile terminal 100. The user input unit 123 may include one or more of a mechanical input element (for example, a key, a button located on a front and/or rear surface or a side surface of the mobile terminal 100, a dome switch, a jog wheel, a jog switch, and the like), or a touch-sensitive input, among others. As one example, the touch-sensitive input may be a virtual key or a soft key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

The sensing unit 140 is typically implemented using one or more sensors configured to sense internal information of the mobile terminal, the surrounding environment of the mobile terminal, user information, and the like. For example, the sensing unit 140 may alternatively or additionally include other types of sensors or devices, such as a proximity sensor 141 and an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The audio output module 152 is generally configured to output audio data. Such audio data may be obtained from any of a number of different sources, such that the audio data may be received from the wireless communication unit 110 or may have been stored in the memory 170. The audio data may be output during modes such as a signal reception mode, a call mode, a record mode, a voice recognition mode, a broadcast reception mode, and the like. The audio output module 152 can provide audible output related to a particular function (e.g., a call signal reception sound, a message reception sound, etc.) performed by the mobile terminal 100. The audio output module 152 may also be implemented as a receiver, a speaker, a buzzer, or the like.

A haptic module 153 can be configured to generate various tactile effects that a user feels, perceive, or otherwise experience. A typical example of a tactile effect generated by the haptic module 153 is vibration. The strength, pattern and the like of the vibration generated by the haptic module 153 can be controlled by user selection or setting by the controller. For example, the haptic module 153 may output different vibrations in a combining manner or a sequential manner.

An optical output module 154 can output a signal for indicating an event generation using light of a light source. Examples of events generated in the mobile terminal 100 may include message reception, call signal reception, a missed call, an alarm, a schedule notice, an email reception, information reception through an application, and the like.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs. The controller 180 may provide or process information or functions appropriate for a user by processing signals, data, information and the like, which are input or output, or activating application programs stored in the memory 170.

To drive the application programs stored in the memory 170, the controller 180 may be implemented to control a predetermined number of the components mentioned above in reference with FIG. 1A. Moreover, the controller 180 may be implemented to combinedly operate two or more of the components provided in the mobile terminal 100 to drive the application programs.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

Some or more of the components may be operated cooperatively to embody an operation, control or a control method of the mobile terminal in accordance with embodiments of the present disclosure. Also, the operation, control or control method of the mobile terminal may be realized on the mobile terminal by driving of one or more application problems stored in the memory 170

Figure 2:
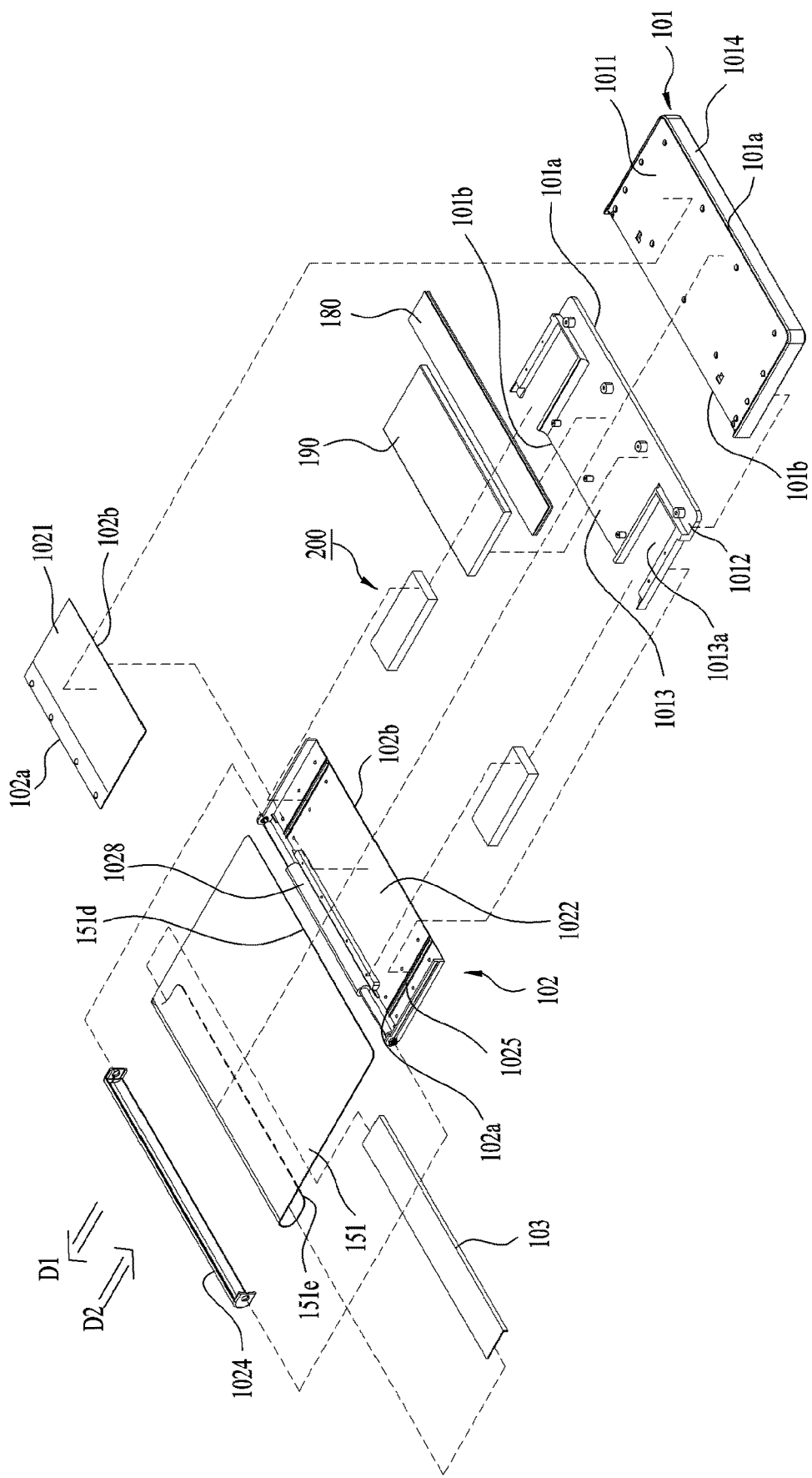
FIG. 2 is an exploded perspective view of a mobile terminal according to one embodiment.
Figure 5:
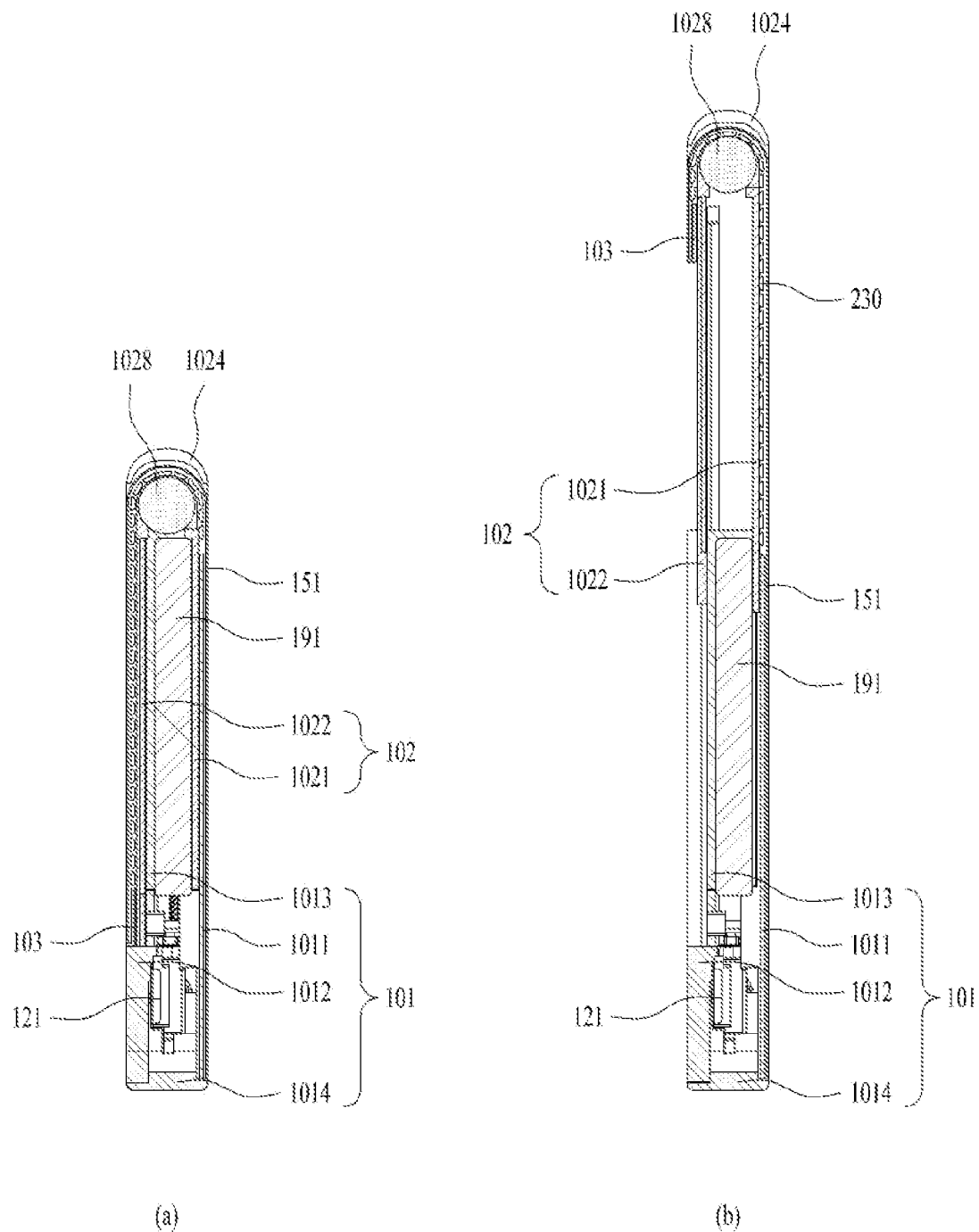
FIG. 5 shows cross-sectional views respectively taken along a line A-A and a line B-B of FIG. 3.

FIG. 2 is an exploded perspective view illustrating a mobile terminal according to the present disclosure. FIG. 3 is a perspective view illustrating first and second states of a mobile terminal viewed in one lateral side. FIG. 4 is a rear view illustrating first and second states of a mobile terminal. FIG. 5 is a sectional view illustrating first and second states of a mobile terminal, obtained along the cutting lines A-A and B-B of FIG. 2, respectively. In the above drawings, FIG. 3(a), FIG. 4 (a) and FIG. 5 (a) illustrate a first state of a mobile terminal and FIG. 3(b), FIG. 4 (b) and FIG. 5 (b) illustrates a second state of the mobile terminal.

As illustrated in the drawings, a mobile terminal 100 of a first state is contracted (or retracted) and has a size smaller than that of the mobile terminal 100 of a second state. Moreover, a size of a display 151 located on a front surface of the mobile terminal 100 becomes smaller than that in a second state. On the other hand, the mobile terminal 100 of the first state is extended in a first direction D1 so as to switch to the second state. In the second state, a size of the mobile terminal 100 and a size of the display 151 located on the front surface become greater than those of the first state. In the following description, a direction in which the mobile terminal 100 and the display 151 thereof are extended (or enlarged) is referred to as a first direction D1, a direction in which the mobile terminal 100 and the display 151 thereof are contracted (or retracted) or reduced is referred to as a second direction D2, and a direction vertical to the first and second directions D1 and D2 is referred to as a third direction.

The mobile terminal 100 of the present disclosure may switch from the first state in which the display 151 is located on the front surface like a bar-type mobile terminal like FIG. 3 (a) to the second state by extending the screen like FIG. 3 (b). In the second state, a size of the display 151 located on the front surface is enlarged and a size of the display 151 located on a rear surface is reduced like FIG. 4 (b). Namely, the display 151 used to be located on the rear surface of the mobile terminal 100 in the first state is moved to the front surface of the mobile terminal 100 in the second state.

Thus, in order for a position of the display to be variable, the display may employ a flexible display unit 151. A flexible display means a display that is light-weighted, easily-unbreakable and heavy-duty display fabricated on a thin and flexible substrate capable of curving, bending, folding, twisting and rolling-up like a paper by maintaining the properties of the existing flat panel display.

Moreover, an electronic paper employs a display technology provided with the features of the normal ink and may differ from the existing flat panel display in using reflective light. The electronic paper may change information by electrophoresis using twist balls or capsules.

In a state that the flexible display unit 151 is not deformed (e.g., a state having an infinite curvature radius: hereinafter a basic state), a display region of the flexible display unit 151 becomes a plane. In a state deformed from the basic state by an external force (e.g., a state having a finite curvature radius: hereinafter a deformed state), the display region may become a curved surface. As illustrated in the drawing, information displayed in the deformed state may become visual information outputted to the curved surface. Such visual information is implemented in a manner that light emittance of subpixels deployed in a matrix form is controlled independently. The subpixel means a minimum unit for implementing a single color.

The flexible display unit 151 may lie not in a flat state but in a curved state (e.g., a top-bottom or right-left curved state) from the basic state. In this case, if an external force is applied to the flexible display unit 151, the flexible display unit 151 may be deformed into a flat state (or a less-curved state) or a more-curved state.

Meanwhile, the flexible display unit 151 may implement a flexible touchscreen by being combined with a touch sensor. If a touch is applied to the flexible touchscreen, the controller 180 (see FIG. 1) may perform a control in response to such a touch input. The flexible touchscreen may be configured to sense a touch input in the deformed state as well as in the basic state.

The touch sensor senses a touch (or a touch input) applied to the touchscreen using at least one of various touch types such as a resistance layer type, an electrostatic capacitance type, an infrared type, an ultrasonic type, etc.

For example, a touch sensor may be configured to convert a pressure applied to a specific portion of a touchscreen or a variation of electrostatic capacitance generated from the specific portion into an electric input signal. A touch sensor may be configured to detect a position or size of the touch sensor touched by a touch target applying a touch to a touchscreen, a pressure of the touch, an electrostatic capacitance of the touch, etc.

Meanwhile, a deformation sensing means for sensing deformation of the flexible display unit 151 may be provided to the mobile terminal 100. Such a deformation sensing means may be included in the sensing unit 140 (see FIG. 1).

The deformation sensing means is provided to the flexible display unit 151 or the case (or housing) (i.e., first to third frame 101 to 103 described later), thereby sensing information related to deformation of the flexible display unit 151. Here, the information related to the deformation includes a deformed direction of the flexible display unit 151, a deformed extent, a deformed position, a deformed time, a restored acceleration of the deformed flexible display unit 151, etc., and may further various kinds of information sensible as the flexible display unit 151 is curved.

Based on the information related to the deformation of the flexible display unit 151 and sensed by the deformation sensing means, the controller 180 may change information displayed on the flexible display unit 151 or generate a control signal for controlling a function of the mobile terminal 100.

The size changes of the display unit 151 on the front and rear surfaces of the mobile terminal according to the state switching (first or second state) of the flexible display unit 151, i.e., the size change of the mobile terminal 100 may be performed manually by a force applied by a user, which is non-limited by the manual way. For example, when the mobile terminal 100 or the flexible display unit 151 is in the first state, it may be deformed into the second state by a command of a user or application without an external force applied by the user. Thus, in order for the flexible display unit 151 to be automatically deformed without such an external force, the mobile terminal 100 may include a driving unit 200 described later.

The flexible display unit 151 of the present disclosure is rolled round a predetermined one of both side parts of the mobile terminal 100, thereby being folded at 180°. Hence, one portion of the display unit 151 is disposed on the front surface of the mobile terminal 100 with reference to such a side part, while the rest is disposed on the rear surface of the mobile terminal 100. Some portion of the display unit 151 located on the front surface of the mobile terminal 100 may be fixed to the front surface not to move, while the rest of the display unit 151 located on the rear surface of the mobile terminal 100 may be provided to be movable on the rear surface.

The display unit 151 may be rolled or unrolled round the side part, whereby a size of the region disposed on the front surface of the mobile terminal 100 may be adjusted by moving a part of the display unit 151 disposed on the rear surface of the mobile terminal 100. Since a size of the flexible display unit 151 is determined and the flexible display unit 151 includes a single continuous body, if a size of the flexible display unit 151 located on the front surface of the mobile terminal 100 is increased, a size of the flexible display unit 151 located on the rear surface of the mobile terminal 100 is decreased. The above-configured display unit 151 may be rolled within the second frame 102 relatively movable to the first frame 101, which will be described later, and more specifically, around a predetermined side part of the second frame 102, and withdrawn (or pulled out) from or inserted (or pushed) into the second frame 102 by being rolled around the second frame 102 along a moving direction of the second frame 102 to adjust the size of the display unit 151 on the front surface of the mobile terminal 100. Such an operation will be described in detail together with other related components of the mobile terminal 100.

Typically, an antenna is disposed in the case or the housing of the mobile terminal 100, but a portion where the antenna is installed in the case or the housing may be limited because of the flexible display unit 151 that covers not only the front face of the mobile terminal 100 but also the rear face thereof. For this reason, the antenna may be implemented on the flexible display unit 151. An antenna on display (AOD) is an antenna in which a transparent film is formed by stacking an electrode layer and a dielectric layer that have patterns engraved thereon, respectively. The antenna on display may be implemented thinner than an antenna implemented using a laser direct structuring (LDS) technology using a conventional copper nickel plating scheme, so that the antenna on display may not be exposed to the outside without affecting a thickness. In addition, the antenna on display may transmit and receive a signal directly to or from the display unit 151. Accordingly, the antenna on display may be used in the mobile terminal 100 in which the display unit 151 is located on the both faces of the mobile terminal 100 as in the present disclosure.

With reference to FIGS. 2 to 5, a detailed configuration of the mobile terminal 100 of the present disclosure will be described in detail below. A following description will be achieved basically with reference to FIG. 2 illustrating an overall configuration. FIGS. 3 to 5 are referred to to explain detailed features of corresponding components in the first and second states of the mobile terminal 100.

The mobile terminal 100 of the present disclosure includes a main frame in which components are mounted, and the main frame of the present disclosure may vary in size in the first direction as shown in FIG. 2. One or more frames move relative to each other, and sizes thereof may vary in the first direction. Electronic components are mounted in the main frame, and the flexible display unit 151 is located out of the main frame.

Since the mobile terminal 100 of the present disclosure includes the flexible display unit, the flexible display unit 151 may be combined in a form surrounding a front face and a rear face of the main frame. The main frame may include first to third frames 101 to 103. The main frame may include the first frame 101, the second frame 102 moving in the first direction with respect to the first frame 101, and the third frame 103 moving in the first direction with respect to the second frame 102. The first frame 101 and the second frame 102 include front portions, a rear portions, and side portions, respectively, and are coupled to each other. Thus, the mobile terminal 100 may have a hexahedral outer shape by such coupled first and second frames 101 and 102. In consideration of an illustrated configuration of the first to third frames 101 to 103, movements of the second and third frames 102 and 103 may be a slide movement.

First of all, the first frame 101 corresponds to a main body of the mobile terminal 100 and may form a space inside to receive various parts therein. And, the first frame 101 may receive the second frame 102, which is movably coupled to the first frame 101, within such a space. Particularly, as illustrated in FIG. 2 and FIG. 5, the first frame 101 may include a first front part 1011 disposed on the front surface of the mobile terminal 100 and first and second rear parts 1011 and 1012 disposed on the rear surface of the mobile terminal 100.

Each of the first front part 1011, the first rear part 1012 and the second rear part 1013 may include an approximately flat plate-type member. The first rear part 1012 and the second rear part 1013 may include separate members coupled together or a single member illustrated in the drawing. In order to form a predetermined space, the first font part 1011 and the first/second rear part 1012/1013 may be spaced apart from each other in a predetermined gap and connected to each other by a lateral part 1014. As parts of the mobile terminal 100, the controller 180 and the power supply unit 190 may be received in the space within the first frame 101. For example, the controller 180 may include a circuit board including a processor and electronic circuit for controlling operations of the mobile terminal 100 and the power supply unit 190 may include a battery and related parts. Moreover, the second frame 102 and the driving unit 200 described alter may be received in the first frame 101 as well.

As described above, the display unit 151 has the continuous body, and thus, may be disposed on both the front face and the rear face of the mobile terminal 100 while being rolled in the mobile terminal 100. The display unit 151 may include the front face positioned at the front face of the mobile terminal 100, the rear face positioned at the rear face of the mobile terminal 100, and the side face positioned between the front face and the rear face thereof and surrounding the side face of the mobile terminal. The front face and the rear face of the display unit 151 are flat, and the side face of the display unit 151 may form a curved face. When the flexible display unit 151 may be damaged when being bent. Thus, the flexible display unit 151 may be formed to be bent with a predetermined curvature.

The display unit 151 may be divided into a fixed portion and a variable portion. The fixed portion means a portion fixed to the frame. Because of being fixed to the frame, the fixed portion maintains a constant shape without changing a bending degree. On the other hand, the variable portion means a portion in which a bending angle or a position of the bent portion changes. The variable portion in which the position or bending angle of the bent portion changes requires a structure for supporting a rear face of the variable portion in response to the change.

A first region of the display unit 151 may be coupled to the first front portion 1011 corresponding to the front face of the mobile terminal 100.

On the other hand, as well illustrated in FIG. 4, for the installation of various physical input units 120 and sensor units 140 for manipulations of the mobile terminal 100, the display unit 151 may be disposed on the second rear part 1013 only. Since the first rear part 1012 is always exposed externally, the input unit 120 such as various buttons, switches, the camera 121 and a flash and the sensor unit 140 such as the proximity sensor 141 may be disposed on the first rear part 1012. A typical bar-type terminal includes a display unit provided to a front surface of the terminal only. Hence, a camera is disposed on a rear surface of the terminal in order to capture an image by viewing a thing located at the opposite side of a user through a display unit. In order for the user to capture himself by viewing himself through the display unit, an additional camera needs to be provided to the front surface of the terminal.

Yet, according to the mobile terminal 100 of the present disclosure, the display unit 151 is located on both of the front and rear surfaces thereof. Therefore, when a user takes a selfie, the display unit located on the same side of the camera 121, i.e., a portion of the display unit 151 located on the rear surface of the mobile terminal 100 in the drawing may be used. When a thing at the opposite side of the user is captured, the display unit located on the opposite side of the camera 121, i.e., a portion of the display unit 151 on the front surface of the mobile terminal 100 in the drawing may be used. For that reason, the mobile terminal 100 may capture a thing located at the opposite side of a user or a selfie using the single camera 121. The camera may include a plurality of cameras of different view angles such as a wide angle, a super wide angle, a telescope, etc. A proximity sensor, an audio output module and the like may be located on the first rear part 1012 as well as the camera, and an antenna 116 may be installed thereon.

The lateral part 1014 may be elongated along edges of the first front part 1011 and the first/second rear part 1012/1013 to enclose a circumference of the first frame 101 and form an exterior of the mobile terminal 100. Yet, as mentioned above, since the second frame 102 is received in the first frame 101 and movably coupled thereto, a portion of the first frame 101 needs to be open to allow the relative movement of the second frame 102 to the first frame 101. As well illustrated in FIG. 2, for example, since the second frame 102 is movably coupled to one of both side parts of the first frame 101, the lateral part 1014 is not formed at such a side part, thereby opening it. Hence, the first frame 101 may include a first side part 101a substantially closed and a second side part 101b disposed to oppose the first side part 101a so as to be open. Since the lateral part 1014 is exposed from the mobile terminal 100, the interface unit 160 for connecting to a power port or an earphone jack or the user input unit 120 such as a volume button and the like may be disposed thereon. In case of containing metal substance, the lateral part 1014 may play a role as an antenna.

The second rear portion 1013 of the first frame 101 may be covered by the display unit, but may be disposed on the front face of the display unit using a transparent material.

Referring to FIG. 2, the second frame 102 may include a second front part 1021 disposed on the front surface of the mobile terminal 100 and a third rear part 1022 disposed on the rear surface of the mobile terminal 100. Like the first front part 1011, the first rear part 1012 and the second rear part 1013 of the first frame 101, each of the second front part 1021 and the third rear part 1022 may be formed of an approximately flat plate-type member. Moreover, the second frame 102 may receive various parts therein and should not interfere with the parts received in the first frame 101 while moving. Hence, the second front part 1021 and the third rear part 1022 may be coupled together in a manner of being spaced apart from each other and have a shape not interfering with the parts within the first frame 101.

Moreover, the display unit 151 may be folded at 180° while being rolled up within the second frame 102 so as to be disposed on both of the front and rear surfaces of the mobile terminal 100. For such arrangement of the display 151, the second frame 102 may include a roller 1028 rotatably disposed therein. The roller 1028 may be disposed at a random position within the second frame 102. Yet, the display 151 should be spread flat on the front and rear surfaces of the mobile terminal 100 to provide a user with a screen of a good quality. For such a spread, an appropriate tension should be provided to the display 151. In order to provide the proper tension, the roller 1028 may be disposed at a first directional end of the second frame 102. The roller 1028 may extend in the third direction, and may be rotatably coupled to the second frame 102.

The display unit 151 may be rolled around the roller 1028 by being gradually curved with a predetermined curvature. Moreover, the roller 1028 may be installed to freely rotate on the second frame 102 by contacting with an inner surface of the display unit 151. Therefore, the roller 1028 is substantially capable of moving the display unit 151 in a direction vertical to a lateral direction, i.e., a length direction of the mobile terminal 100. As described later, when the second frame 102 is slid, the display unit 151 is moved by the tension applied by the second frame 102 to the front or rear surface of the mobile terminal 100 relatively to the second frame 102 in a different direction (i.e., the first direction D1 or the second direction D2). In doing so, such a movement may be guided by the roller 1028 that is rotating.

In addition, the roller 1028 is disposed on a first side portion 102*a* of the second frame 102, and the first side portion 102*a* actually corresponds to an outermost side portion of the mobile terminal 100. When the first side portion 102*a* of the second frame 102 is exposed, the display unit 151 rolled on the roller 1028 may be damaged. Accordingly, the second frame 102 may include a side frame 1024 disposed on the first side portion 102*a*.

The side frame 1024 extends in the longitudinal direction of the second frame 102 to cover the first side portion 102*a*, thereby protecting the roller 1028 and the display unit 151 rolled thereon. That is, the side frame 1024 covers the side face of the display unit 151, and the side face thereof is located in the third region. The first to third regions are at specified positions on the flexible display unit and do not change in size or position, but the sizes of the front face and the rear face, and the position of the side face are determined based on the state of the main frame.

The first region and the second region correspond to the fixed portion described above, and the third region corresponds to the variable portion described above.

The third region may vary in position depending on the state of the mobile terminal. Because the side face is rolled by the roller, the side face is bent with the predetermined curvature, and an inner face of the side frame may include a curved face corresponding to the curvature of the side face.

Because of the side frame 1024, the second frame 102 may have the substantially closed first side portion 102*a*, and the side frame 1024 may substantially form the outer shape of the mobile terminal 100 together with the side face 1014 of the first frame 101. In addition, the second frame 102 may include a second side portion 102*b* that is disposed opposite the first side portion 102*a* to minimize interference with the components within the first frame 101 during the movement, and is opened.

Such a second frame 102 is movably coupled to the first frame 101, and thus may slide in the predetermined first or second direction D1 or D2 relative to the first frame 101. More specifically, the second frame 102 may be movably coupled to the first frame 101 through the side portion of the first frame 101, more precisely, through the opened second side portion 101*b*, as shown. More specifically, the second side portion 102*b* of the second frame is disposed relatively adjacent to the first side portion 101*a* of the first frame 101 which is closed. Accordingly, the first side portion 102*a* of the second frame may be disposed to be opposite to the first side portion 101*a*. Accordingly, the second side portion 102*b* is inserted into the first frame 101 through the side portion of the first frame, that is, the second side portion 101*b* thereof. The first side portion 102*a* is not inserted into the first frame 101 but is always located outside the first frame 101, thereby forming the outer shape of the mobile terminal 100 as described above. However, when necessary, such first side portion 102*b* of the second frame 102 may also be inserted into the first frame 101.

Because of such positional relationship, the second frame 102 may extend from or contract to the first frame 101 in a direction perpendicular to the longitudinal direction of the mobile terminal 100 or the first frame 101. That is, the first and second directions D1 and D2 may basically be directions perpendicular to the longitudinal direction of the mobile terminal 100 or the first frame 101. Further, the first and second directions D1 and D2 may also be described as the lateral direction or the horizontal direction of the mobile terminal 100 or the first frame 101. In addition, during the movement in the first direction D1, the second frame 102 extends from the first frame 101. Accordingly, the first direction D1 may be a direction in which the second frame 102 moves away from the first frame 101, that is, moves outwardly of the mobile terminal 100 or the first frame 101. On the other hand, during the movement in the second direction D2, the second frame 102 contracts to the first frame 101. Thus, the second direction D2 is a direction opposite to the first direction D1, so that the second direction D2 may be a direction in which the second frame 102 moves to become closer to the first frame 101, that is, moves inwardly of the mobile terminal 100 or the first frame 101. When being moved in the first direction D1, such second frame 102 extends and applies a force to the portion of the display unit 151 disposed on the rear face of the mobile terminal 100, so that the portion of the display unit 151 may be disposed on the front face of the mobile terminal 100, and a region for such additional arrangement may be defined.

Thus, the second frame 102 may convert the mobile terminal 100 into the second state with the display unit 151 with the relatively extended front face by moving in the first direction D1. On the other hand, when being moved in the second direction D2, the second frame 102 contracts into an original state thereof, and applies a force to the portion of the display unit 151 disposed on the front face of the mobile terminal 100 to return to the rear face of the mobile terminal 100 again. Thus, the second frame 102 may convert the mobile terminal 100 into the first state with the display unit 151 with the relatively contracted front face by moving in the second direction D2. Accordingly, the second frame 102 selectively exposes the display unit 151 to the front face of the mobile terminal 100 depending on the moving direction (i.e., the first or second direction D1 and D2). Accordingly, the mobile terminal 100 may be converted into the first or second state defined above.

During the expansion and the contraction in such first and second directions D1 and D2, the second frame 102 may overlap the first frame 101, more precisely, the first front portion 1011 and the first rear portion 1012 thereof so as not to interfere with the first frame 101. More specifically, the display unit 151 may be coupled to and supported by the first front portion 1011 of the first frame 101, as described above. Accordingly, the display unit 151 does not need to be additionally supported by the second front portion 1021 of the second frame 102. Rather, when the second front portion 1021 is interposed between the first front portion 1011 and the display unit 151, the display unit 151 may be deformed or damaged because of friction with the second front portion 1021, which is repeatedly moved. Thus, the second front portion 1021 may be disposed below the first front portion 1011, as shown in FIG. 5. That is, a front face of the second front portion 1021 may face the rear face of the first front portion 1011. In addition, the rear face of the first front portion 1011 may be in contact with the front face of the second front portion 1021 to stably support the movement of the second frame 102.

The third rear portion 1022 of the second frame 102 may be disposed below the second rear portion 1013 of the first frame 101. That is, the front face of the third rear portion 1022 may face the rear face of the second rear portion 1013. In addition, the rear face of the second rear portion 1013 may be in contact with the front face of the third rear portion 1022 to stably support the movement of the second frame 102. Because of such arrangement, the third rear portion 1022 may be exposed to the outside of the first frame, more precisely, of the second rear portion 1013, and may be coupled to the display unit 151.

Alternatively, when the second rear portion 1013 is made of a transparent material, the second rear portion 1013 may form an outer shape of the rear face of the mobile terminal. The second rear portion 1013 may be positioned rearward of the third rear portion 1022 of the second frame, and the flexible display unit may be disposed between the second rear portion 1013 and the third rear portion 1022 in the first state.

When the second rear portion 1013 is made of a material such as a transparent glass to form the outer shape of the rear face of the mobile terminal, the first rear portion 1012 may be implemented using the same member as the second rear portion 1013. That is, the camera 121, the flash or the sensing unit 140, and the like may be arranged by partially coating the plate-shaped member of the transparent glass material to not allow the internal components to be visible and by not coating only a required portion.

In addition, the second frame 102 may expand and contract the size of the mobile terminal 100 itself, particularly the front face of the mobile terminal 100 by the expansion and the contraction in the first and second directions D1 and D2. Thus, the display unit 151 must move by such extended or reduced front face size to obtain the intended first and second states. However, when being fixed to the second frame 102, the display unit 151 may not be moved smoothly to be adapted for the front face of the mobile terminal 100 that is expanded or contracted. For this reason, the display unit 151 may be movably coupled to the second frame 102. More specifically, the display unit 151 may include a first side edge (or side end) 151d disposed on the front face of the mobile terminal 100 and a second side edge 151e opposite to the first side edge 151d and disposed on the rear face of the mobile terminal 100. The first side edge 151 may be disposed on the front face of the first frame 101, that is, the front face of the first front portion 1011 thereof, and may be disposed adjacent to the side portion of the mobile terminal 100, that is, the first side portion 101a of the first frame. On the other hand, since the second side edge 151e is adjacent to the rear face of the mobile terminal 100 and the third rear portion 1022 of the second frame 102, the second side edge 151e may is be coupled the third rear portion 1022 of the second frame 102 to be movable in the first and second directions D1 and D2. In addition, since the display unit 151 is not structurally strong, a third frame 103 may be coupled to the second side edge 151e. The third frame 103 may be formed of a plate-shaped member extending in the longitudinal direction of the mobile terminal 100. Accordingly, the third frame 103 may be coupled to the second frame, that is, the third rear portion 1022 thereof to be movable in the first and second directions D1 and D2 instead of the second side edge 151e. In addition, the second frame 102 may include a slot 1025 extending in the lateral direction of the mobile terminal 100 or the second frame 102, that is, the direction perpendicular to the longitudinal direction thereof. Further, the third frame 103 may be stably moved while being guided by the slot 1025. The third frame 103 may include, for example, a projection inserted into the slot 1025 for the movement along the slot 1025.

Referring to FIGS. 3 to 5, in connection with such configuration of the first to third frames 101, 102, and 103, the display unit 151 may include a first region 1511 extending from one side thereof, that is, the first side edge 151d toward the second side edge 151e by a predetermined length, and a second region 1512 disposed opposite the first region 1511, and extending from the second side edge 151e toward the first side edge 151d by a predetermined length. In addition, the display unit 151 may include a third region 1513 disposed between the first and second regions 1511 and 1512. Such first to third regions 1511, 1512, and 1513 may be connected to each other, and may form a continuous body of the display unit 151. In addition, as described above, for the movement of the third region 1513 toward the front face or the rear face of the mobile terminal 100 depending on the moving direction of the second frame 102, the first region 1511 may be fixed so as not to move to the front face of the mobile terminal 100, and the second region 1512 may be provided to be movable on the rear face of the mobile terminal. Such configuration of the display unit 151 will be described in more detail below.

The first region 1511 may be disposed on the front face of the mobile terminal 100, more specifically, the first frame 101, that is, on the front face of the first front portion 1011. The first region 1511 is fixed to the first frame 101, that is, the front face of the first front portion 1011 so as not to be moved during the movement of the second frame 102, and thus, the first region 1511 may always be exposed to the front face of the mobile terminal 100. The third region 1513 may be adjacent to the first region 1511, and may extend into the second frame 102 and rolled on the roller 1028. The third region 1513 may consecutively extend out of the second frame 102 again and partially cover the second frame 102, that is, the rear face of the third rear portion 1022. Further, the second frame 102, that is, the third rear portion 1022, is adjacent to the first frame 101, that is, the second rear portion 1013 and together forms the rear case of the mobile terminal 100, so that it may be described that the third region 1513 is also disposed on the rear face of the first frame 101.

The second region 1512 may be adjacent to the third region 1513 and may be disposed on the rear face of the mobile terminal 100, more specifically, on the second frame, that is, the rear face of the third rear portion 1022 thereof. The second region 1512 may be coupled to the third frame 103 without being directly coupled to the second frame 102. As shown in FIG. 4 (b), the slot 1025 extending in the lateral direction (i.e., the direction perpendicular to the longitudinal direction of the mobile terminal 100) to the second frame 102, that is, to the third rear portion 1022 is defined. Further, the third frame 103 may move along the slot 1025. In FIG. 4 (b), it is shown that the slot 1025 is defined in the rear face of the second frame 102, but may be defined in the side face of the second frame 102. Although the second region 1512 may move in the first or second direction D1 or D2 with respect to the second frame 102 together with the third frame 103, the movement of the second region 1512 may be restricted within the rear face of the mobile terminal 100 by the slot 1025. That is, the second region 1512 does not move out of the second frame 102 even when the second frame 102 is extended or contracted, and may move along the slot 1025 within the second frame 102 by the extended or contracted distance of the second frame 102. Accordingly, the second region 1512 may always be exposed to the rear face of the mobile terminal 100.

As a result, the first region 1511 may be disposed on the front face of the mobile terminal 100 and may be always exposed to the front face regardless of the movement of the second frame 102, and the second region 1512 may be disposed on the rear face of the mobile terminal 100 and may be always exposed to the rear face regardless of the movement of the second frame 102. In addition, the third region 1513 may be disposed between the first and second regions 1511 and 1512, and may be selectively placed on the front face or the rear face of the mobile terminal 100 depending on the moving directions D1 and D2 of the second frame 102.

Because of such selective placement of the third region 1513, as shown in FIG. 4 (b), the second rear portion 1013 of the first frame 101 is covered by the second and third regions 1512 and 1513 and the third rear portion 1022 of the display unit 151 in the first state, but the third region 1513 moves to the front face of the mobile terminal 100 in the second state, and the third rear portion 1022 also moves in the first direction D1, so that the mobile terminal 100 may be exposed to the outside. In addition, the second front portion 1021 of the second frame 102 is disposed below the first front portion 1011 of the first frame 101 in the first state, but is moved out of the first frame 101 and supports the third region 1513 of the display unit 151 disposed on the front face of the mobile terminal 100 in the second state.

Since the first and second regions 1511 and 1512 are always respectively arranged on the front face and the rear face of the mobile terminal 100, curvatures of the first region 1511 and the second region 1512 do not change, and the first region 1511 and the second region 1512 may be maintained in a flat basic state. However, the third region 1513 may be rolled on the roller 1028 and bent in the second frame 102. When converting from the first state to the second state, the third region 1513 may extend from the second frame 102 to the front face of the mobile terminal 100 while being rolled on the roller 1028 in one direction. On the other hand, when converting from the second state to the first state, the third region 1513 may be retracted from the front face of the mobile terminal 100 to the second frame 102 while being rolled on the roller 1028 in the opposite direction, and at the same time, may return to the rear face of the mobile terminal 100 from the second frame 102. A specific location of the foldable mobile terminal in a form of being spread like a book is easily damaged because only the specific location is folded repeatedly. On the other hand, the deformed portion of the flexible display unit 151, that is, a portion rolled on the roller 1028, may vary based on the first and second states of the mobile terminal 100, that is, the movement of the second frame 102. Accordingly, the mobile terminal 100 of the present disclosure may significantly reduce deformation and fatigue repeatedly applied to a specific portion of the display unit 151, thereby preventing damage to the display unit 151.

Based on the above-described configuration, overall operations of the mobile terminal 100 will be described as follows. As an example, the state conversion may be performed manually by the user, and an operation of the mobile terminal 100 during such manual state conversion will be described. However, operations of the first to third frames 101 to 103 and the display unit 151, which will be described below, may be performed in the same manner when a power source other than a user's force is used, for example, when the driving unit 200 to be described below is applied.

As shown in FIGS. 3A, 4A, and 5A, the second frame 102 is fully retracted into the first frame 102 in the first state. Therefore, only the first region 1511 of the display unit 151 fixed to the front face of the first frame 101 may be exposed to the front face of the mobile terminal 100. Such first region 1511 may be fixed and supported to the first frame 101, that is, the first front portion 1011 thereof. In addition, a major portion of the third region 1513 may be disposed on the rear face of the mobile terminal 100 together with the second region 1512, and the third region 1513 may be disposed in the second frame 102 while being partially rolled on the roller 1028. The third region 1513 of the rear face of the mobile terminal 100 may be supported by the second frame, that is, the third rear portion 1022 thereof. The second region 1512 may be fixed by the third frame 103 disposed on the second frame (i.e., the third rear portion 1022) and may be movably coupled to the second frame 1012.

In such first state, when the second frame 102 moves in the first direction D1, the mobile terminal 100 may be converted into the second state. As shown in FIGS. 3B, 4B, and 5B, the second frame 102 may extend from the first frame 101 by the movement in the first direction D1, and may increase the overall size of the mobile terminal 100, in particular, the front face thereof. During the movement in the first direction D1, the second frame 102 may apply a force, that is, a tension, to the display unit 151 in the first direction D1. The display unit 151 is fixed to the first frame 101 but is coupled to the second frame 102 so as to be movable using the third frame 103, so that the force applied by the second frame 102 allows the third region 1513 to be rolled out from the roller 1028 of the second frame 102 to the front face of the mobile terminal 100. That is, the third region 1513 may be withdrawn (or pulled out) from the second frame 102 or extend to (or move out of) the second frame 102. At the same time, the third region 1513, particularly, the portion located on the rear face of the third region 1513 may be rolled into the roller 1028 of the second frame 102 from the rear face, or may be inserted (or pushed in), retracted, or moved into the second frame 102. Not an entirety of the third region 1513 is withdrawn from the second frame 102 to the front face of the mobile terminal 100, and a portion of the third region 1513 may be disposed in the second frame 102 while still being rolled on the roller 1028. In addition, for the smooth movement of the third region 1513, the second region 1512 may also move in the first direction D1 with respect to the second frame 102 together with the third frame 103. In addition, as described above, the second region 1512 and the third frame 103 may be constrained to the second frame 102 and move in the first direction D1 with respect to the first frame 101 together with the second frame 102. Accordingly, the second region 1512 and the third frame 103 may move in the first direction D1 relative to the first frame 101 as well as the second frame 102, and accordingly, move a distance longer than the moved distance of the second frame 102. Thus, because of such long distance movement in the first direction D1 of the second region 1512, the third region 1513 may be smoothly extended to the front face of the mobile terminal 100. Further, for the movement of the third region 1513, which is proportional to the expansion of the second frame 102, the movement of the second region 1512 and the third frame 103 in the first direction D1 may be performed simultaneously with the movement of such third region 1512 and second frame 102 in the first direction D1 so as to be proportional to the movement of third region 1513 and second frame 102.

When the second frame 102 is fully extended in the first direction D1, the first and third regions 1511 and 1513 may be arranged on the front face of the mobile terminal 100, and only the second region 1512 may be disposed on the rear face of the mobile terminal 100. Such first and third regions 1511 and 1513 may be supported by the first frame (i.e., the first front portion 1011 thereof) and the second frame (i.e., the second front portion 1021 thereof). In addition, the second frame 102, i.e., the third rear portion 1022 thereof exposes the second rear portion 1013 of the first frame while extending in the first direction D1, and supports the moving third region 1513. Therefore, in the second state, the mobile terminal 100 may have the extended front face display unit 151.

On the other hand, when the second frame 102 moves in the second direction D2 in the second state, the mobile terminal 100 may again return into the first state as shown in FIGS. 3A, 4A, and 5A. The second frame 102 may be contracted to the first frame 101 by the movement in the second direction D2, and may reduce the overall size of the mobile terminal 100, particularly the front face thereof. The movement of the display unit 151 during such movement of the second frame 102 may be performed in a reverse order of the movement in the first direction D1 described above. In brief, the third region 1513 may be rolled from the front face of the mobile terminal 100 into the roller 1028 of the second frame 102, or may be inserted, retracted, or moved into the second frame 102. At the same time, the third region 1513 may be rolled, withdrawn, extended, or moved out of the roller 1028 of the second frame 102 to the rear face of the mobile terminal 100. Not the entirety of the third region 1513 may be withdrawn from the second frame 102 to the rear face of the mobile terminal 100, and the portion of the third region 1513 may still be placed in the second frame 102 while still being rolled on the roller 1028. In addition, for such smooth movement of the third region 1513, the second region 1512 may also move in the second direction D2 with respect to the second frame 102 together with the third frame 103. The second region 1512 and the third frame 103 may be constrained to the second frame 102 to move in the second direction D2 with respect to the first frame 101 together with the second frame 102. Accordingly, the second region 1512 and the third frame 103 may move relatively in the second direction D2 with respect to not only the second frame 102 but also the first frame 101. As a result, the second region 1512 and the third frame 103 may move in the second direction D2 a distance larger than the moved distance of the second frame 102. Thus, because of such long distance movement of the second region 1512, the third region 1513 may be smoothly returned to the rear face of the mobile terminal 100. Further, for the movement of the third region 1513 proportional to the contraction of the second frame 102, the movements of the second region 1512 and the third frame 103 in the second direction D2 may be performed simultaneously with the movements of the third region 1512 and the second frame 102 in the second direction D2 to be proportional to the movements of the third region 1513 and the second frame 102. When the second frame 102 is completely contracted in the second direction D2, the mobile terminal 100 may be converted into the first state as described above, and may have the display unit 151 with the front face that is relatively reduced in comparison with the second state in the first state.

The flexible display unit 151 containing the variable portion is applicable not only to the above-described embodiment in which a width in the first direction of the mobile terminal 100 is variable because of the sliding of the second frame 102, but also to a mobile terminal in which an angle between the plurality of frames 101 and 102 may vary.

For example, the flexible display unit may be applied to a mobile terminal including a first frame and a second frame that is hinge coupled to one side of the first frame and an having a variable angle with the first frame. A variable portion of the mobile terminal of such form may mean a position where a bending angle changes when the angle between the first frame and the second frame changes, and may be located between the first frame and the second frame.

One face of the flexible display unit 151 may output the video thereon, and may be exposed to the outside. Because a bent position or a curvature of bending deflection varies in the variable portion, a support frame 230 in which a curvature thereof may vary corresponding thereto is required. The support frame 230 is a flexible member coupled to the other face of the variable portion of the flexible display unit. When the support frame 230 supports the other face of the flexible display unit 151, stable touch input may be possible even in the variable portion, and the variable portion may be prevented from being damaged by the external force.

In addition, as described above, the second front portion 1021 of the second frame is inside the first front portion 1011 of the first frame in the first state, and then moves in the first direction in the second state, so that a gap corresponding to a thickness of the first front portion 1011 occurs between the flexible display unit 151 and the second front portion 1021. Using the support frame 230 having a thickness corresponding to the gap, a problem in which the front portion extended in the second state is spaced apart from the second front portion 1021 may be solved.

When the support frame 230 has sufficient rigidity, the second front portion may be omitted. Hereinafter, the support frame 230 supporting the variable portion of the flexible display unit will be described in detail.

Figure 6:
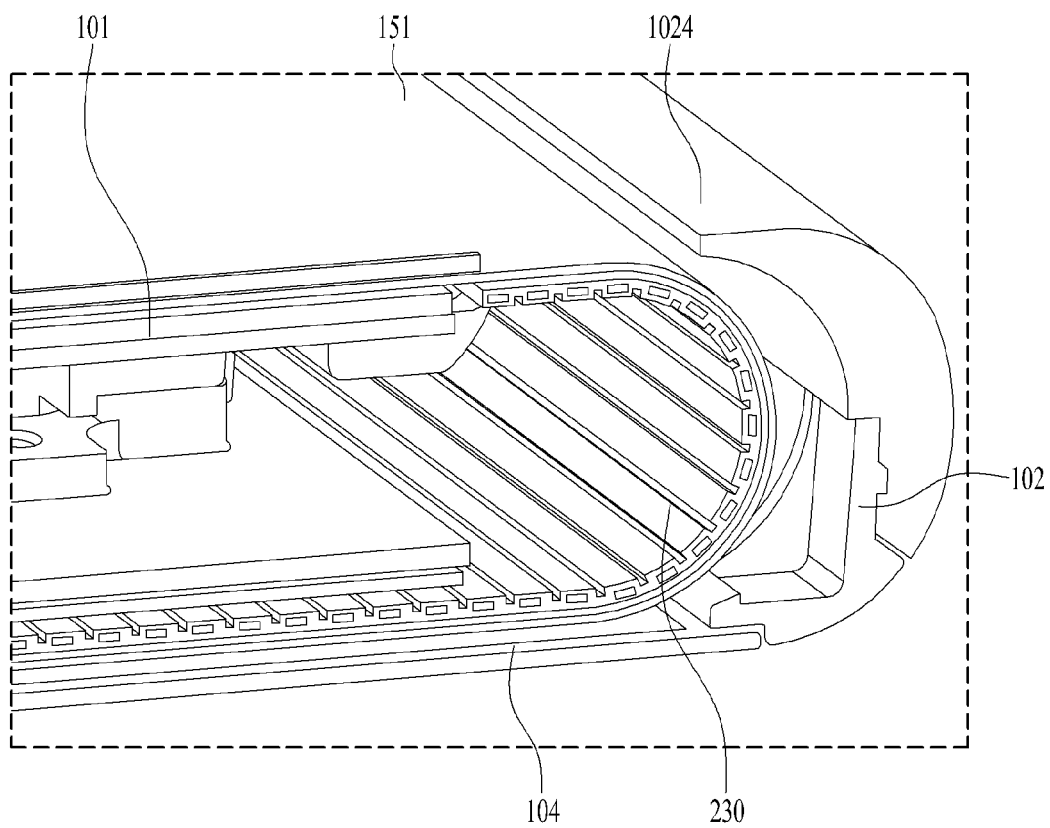
FIG. 6 is a diagram showing a coupled state of a flexible display unit and a support frame of the present disclosure.

In a case of the flexible mobile terminal 100, which is the mobile terminal 100 of the type in which the sizes of the frames 101 and 102 are extended and reduced as shown in FIG. 2, the above-described foldable type mobile terminal 100 may be configured such that the flexible display unit 151 is bent with curvature only in a specific direction without bending in all directions. In order to consider the structures of the frames 101 and 102 and to minimize a possibility of damage of the flexible display unit 151, the flexible display unit 151 may be bent only in a specific direction (first direction). The support frame 230 may also be bent only in the first direction, and may have rigidity in the third direction perpendicular to the first direction. FIG. 6 illustrates a coupling state of the flexible display unit 151 and the support frame 230 of the present disclosure. One face of the support frame 230 may be positioned on the other face of the variable portion of the flexible display unit 151, and may vary as the form of the variable portion varies.

The support frame 230 includes a plurality of rigid bars 231 short in the first direction and elongated in the third direction. The rigid bar 231 may use a metal member having rigidity such as SUS or STS. The rigid bar 231 extending in the third direction provides rigidity in the third direction and is short in the first direction, thereby minimizing an effect on the bending deflection in the first direction of the flexible display unit 151. As shown in FIG. 6, the plurality of rigid bars 231 may be arranged side by side in the first direction.

Since it is difficult to couple the plurality of rigid bars 231 to the rear face of the flexible display unit 151 one by one, a flexible portion 232 made of a flexible material may be connected between the plurality of rigid bars 231 in the present disclosure. The flexible portion 232 may contain the flexible material, such as silicon, and arrange the plurality of rigid bars 231 in parallel, and be coupled with the plurality of rigid bars 231 in a double injection molding scheme to form one support frame 230.

FIG. 7 is a diagram showing the support frame 230 according to an embodiment of the present disclosure. As shown in FIG. 7 (a), the flexible portion 232 may include a first flexible portion 232a located between the rigid bars 231, a second flexible portion 232b enclosing the other side of the rigid bar 231, and a third flexible portion 232c enclosing a front portion of the rigid bar 231.

The first flexible portion 232a may include a groove 233 located between the rigid bars 231 by being recessed concavely in a direction of the other side to facilitate the support frame 230, as shown in FIG. 7 (a), to be bent in a first direction. The groove 233 is extended in the same direction of the rigid bar 231, i.e., a third direction. Since thickness of the first flexible portion 232a is thin, the first flexible portion 232a is bent, thereby guiding the bending deformation of the support frame 230 in the first direction.

The second flexible portion 232b and the third flexible portion 232c connects the spaces between the first flexible portions 232a, thereby raising the coupling force between the rigid bar 231 and the flexible portion 232. As shown in FIG. 7 (a), the shape of enclosing the rigid bar 232 entirely may raise the coupling force between the rigid bars 231, and may provide the support frame 230 in uniform thickness despite that the rigid bar 231 has a position error in thickness direction.

To couple one side of the above-configured support frame 230 to the other side of the flexible display unit 151, an adhesive tape is usable. As the adhesive tape has low adhesiveness with flexible material such as silicon, there is a concern that the adhesive tape may be detached from the one side of the support frame 230.

To solve the above problem, as shown in FIG. 7 (b), the third flexible portion 232c may be omitted to enable the rigid bar 231 to be exposed in one side direction of the support frame 230. After manufacturing the support frame 230 like FIG. 7 (a), the flexible portion 232 on one side of the support frame 230 may be removed. Alternatively, the support frame 230 may be manufactured by double injection molding in a manner of that the flexible portion 232 is not coupled in the one side direction of the rigid bar 231. The support frame 230 of the present embodiment has high adhesiveness with the adhesive tape, thereby being stably coupled to the flexible display unit 151.

FIG. 8 is a diagram showing a lateral protection portion 235 of the present disclosure. The flexible display unit 151 is vulnerable to an impact in a plane direction, and more particularly to a lateral impact. Particularly, since the variable portion varies in an angle or position of a bent portion, it is unable to dispose a side case for lateral protection, whereby the variable portion is exposed. To reinforce the rigidity of the variable portion of the flexible display unit 151 exposed in a lateral direction, as shown in FIG. 8, the lateral protection portion 235 may be further included.

The lateral protection portion 235 may be located at both end portions of the variable portion of the flexible display unit 151 in the third direction. Since the bending deformation occurs in the first direction, the shape of the end portion in the third direction is changed. Hence, the lateral protection portion 235 may be provided to change in response to the deformation of the flexible display unit 151.

Looking into the cross-section shown in FIG. 8 (b), the lateral protection portion 235 may form a u-shaped structure that encloses an end portion of one side of the flexible display unit 151, an end portion of the other side of the flexible display unit 151, and a lateral side of an end portion of the flexible display unit 151 in the third direction. If the lateral protection portion 235 of thin and soft material is used, it can vary in response to the deformation of the flexible display unit 151.

For the coupling force between the lateral protection portion 235 and the flexible display unit 151, as shown in FIG. 8 (b), a first protection portion 235a and a second protection portion 235b are disposed while contacting with one side and the other side of the flexible display unit 151. Yet, a third protection portion 235c may be disposed in a manner of being spaced apart from the lateral side of the flexible display unit 151 so as not to transfer an external impact to the lateral side of the flexible display unit 151 in direct.

In addition, an edge between the first protection portion 235a and the second protection portion 235 faces outward in a direction of a first side of the flexible display unit 151. Therefore, as shown in FIG. 8 (b), the edge between the first protection portion 235a and the second protection portion 235b may be rounded.

The support frame 7 described in FIG. 7 and the lateral protection portion 235 may be configured with a single member. If the flexible portion 232 and the lateral protection portion 235 of the support frame 230 are formed of the same material, they can be configured as an integral part. If coupled by being inserted in the flexible display unit 151 in the first direction, the support frame 230 may be prevented from being separated from the other side of the flexible display unit 151. As described above, in the mobile terminal 100 of the present disclosure, as the support frame 230 is well bent in response to the bending deformation of the flexible display unit 151 and simultaneously supports the other side of the variable portion stably, the flexible display unit 151 may be stably deformed in response to the deformation of the mobile terminal 100.

In addition, as the lateral protection portion 235 protecting the lateral side of the variable portion of the flexible display unit 151 is included, the lateral side of the variable portion of the flexible display unit 151 may be prevented from being broken or damaged.

The above detailed description should not be construed as being limitative in all terms, but should be considered as being illustrative. The scope of the present invention should be determined by reasonable analysis of the accompanying claims, and all changes in the equivalent range of the present invention are included in the scope of the present invention.

What is claimed is:

1. A mobile terminal, comprising:
   a frame varying in shape or size;
   a flexible display unit including a fixed portion coupled to the frame by having one side facing outward and a variable portion configured to bend in a first direction; and
   a support frame supporting the variable portion in a manner that one side of the support frame is disposed to face a corresponding side of the variable portion of the flexible display unit, the support frame comprising:
   a plurality of rigid bars extended in a second direction orthogonal to the first direction
   and disposed side-by-side with the first direction; and
   a flexible portion coupling the rigid bars, the flexible portion comprising:
      a plurality of first flexible portions located between a plurality of the rigid bars; and
      a second flexible portion connecting gaps between the first flexible portions and covering a side of the rigid bar facing the frame,
   wherein the each of first flexible portions includes a groove recessed from a direction of an opposing side of the support frame, and
   wherein the groove is extended in the second direction.

2. The mobile terminal of claim 1, further comprising:
   an adhesive tape located between the support frame and the flexible display unit, wherein one side of the rigid bar is exposed and contacts with the adhesive tape.

3. The mobile terminal of claim 1, further comprising:
   a lateral protection portion covering lateral sides of the variable portion of the flexible display unit in a second direction orthogonal to the first direction and formed of flexible material.

4. The mobile terminal of claim 3, wherein the lateral protection portion comprises:
   a first protection portion located at an end portion of the one side of the flexible display unit;
   a second protection portion located at an end portion of an opposite side of the flexible display unit; and
   a third protection portion covering a lateral side of the flexible display unit,
   wherein the first to third protection portions form a u-shaped structure.

5. The mobile terminal of claim 4,
   wherein the first protection portion and the second protection portion contact with one side and an opposite side of the flexible display unit, respectively, and
   wherein the third protection portion does not contact the lateral side of the flexible display unit.

6. The mobile terminal of claim 3, wherein the lateral protection portion is connected to the support frame.

7. The mobile terminal of claim 1, wherein the frame comprises:
   a first frame having a front side coupled with the fixed portion of the flexible display unit; and
   a second frame sliding to move in the first direction with respect to the first frame,
   wherein the variable portion bends in response to a slide moving position of the second frame.

8. The mobile terminal of claim 1, the frame comprising:
   a first frame; and
   a second frame located on one side of the first frame and varying in an angle to the first frame,
   wherein the flexible display unit is located on front sides of the first frame and the second frame and
   wherein a curvature of the variable portion varies depending on an angle between the first frame and the second frame.

9. The mobile terminal of claim 1, wherein the flexible portion comprises silicon.

* * * * *